United States Patent
Chang et al.

(10) Patent No.: US 9,411,475 B2
(45) Date of Patent: Aug. 9, 2016

(54) KEYBOARD

(71) Applicants: DARFON ELECTRONICS (SUZHOU) CO., LTD., Suzhou, Jiangsu Province (CN); DARFON ELECTRONICS CORP., Taoyuan (TW)

(72) Inventors: Ching-Chuan Chang, Taoyuan (TW); Chia-Hung Liu, Taoyuan (TW)

(73) Assignees: DARFON ELECTRONICS (SUZHOU) CO., LTD., Suzhou, Jiangsu Province (CN); DARFON ELECTRONICS CORP., Taoyuan, Taiwan (CN)

( * ) Notice: Subject to any disclaimer, the term of this patent is extended or adjusted under 35 U.S.C. 154(b) by 128 days.

(21) Appl. No.: 14/096,032

(22) Filed: Dec. 4, 2013

(65) Prior Publication Data

US 2014/0151212 A1   Jun. 5, 2014

(30) Foreign Application Priority Data

Dec. 4, 2012   (TW) .............................. 101145458 A

(51) Int. Cl.
*H01H 9/26* (2006.01)
*H01H 13/72* (2006.01)
*H01H 13/76* (2006.01)
(Continued)

(52) U.S. Cl.
CPC .............. *G06F 3/044* (2013.01); *H03K 17/975* (2013.01); *G06F 2203/04103* (2013.01); *H03K 2217/9653* (2013.01)

(58) Field of Classification Search
CPC ......... H01H 9/26; H01H 13/72; H01H 13/76; H01H 36/00; H01H 36/004; H01H 36/008; H01H 2201/00; H01H 2201/018; H01H 2219/036; H01H 2219/037; H01H 2215/05; H01H 2215/044; H01H 2221/04; H01H 2221/046; H01H 2221/048; H01H 3/00; H01H 3/02; H01H 3/12; H01H 13/00; H01H 13/02; H01H 13/14; H01H 13/20; H01H 13/26; H01H 13/50; H01H 13/52; H01H 13/70; H01H 36/002; H01H 2003/12
USPC ......................................................... 200/5 A
See application file for complete search history.

(56) References Cited

U.S. PATENT DOCUMENTS

| | | | |
|---|---|---|---|
| 5,278,372 A * | 1/1994 | Takagi et al. ................. 200/344 |
| 6,924,789 B2 * | 8/2005 | Bick ............................. 345/168 |
| 2010/0309030 A1 * | 12/2010 | Huang et al. .................... 341/33 |
| 2012/0160648 A1 | 6/2012 | Chao |

FOREIGN PATENT DOCUMENTS

| CN | 101888424 A | 11/2010 |
|---|---|---|
| CN | 102035525 A | 4/2011 |
| CN | 202189341 U | 4/2012 |

(Continued)

*Primary Examiner* — Renee Luebke
*Assistant Examiner* — Anthony R. Jimenez
(74) *Attorney, Agent, or Firm* — Winston Hsu; Scott Margo

(57) ABSTRACT

A keyboard includes a non-conductive board, a plurality of keyswitches, and a capacitive touch sensing sheet. The plurality of keyswitches is disposed on the non-conductive board. Each keyswitch includes a keycap and a support device. The support device is connected to the keycap and the non-conductive board so as to make the keycap movable between a pressing position and a non-pressing position relative to the non-conductive board. The capacitive touch sensing sheet is disposed under the non-conductive board for providing a cursor signal to a computer device.

25 Claims, 5 Drawing Sheets

(51) Int. Cl.
    *G06F 3/044*     (2006.01)
    *H03K 17/975*   (2006.01)

(56) References Cited

FOREIGN PATENT DOCUMENTS

| | | |
|---|---|---|
| CN | 102541275 A | 7/2012 |
| CN | 202524372 U | 11/2012 |
| TW | 315010 | 9/1997 |
| TW | M250242 | 11/2004 |
| TW | M384354 | 7/2010 |
| TW | 201036019 | 10/2010 |
| TW | M390488 | 10/2010 |
| TW | M404420 | 5/2011 |
| TW | 201145331 | 12/2011 |
| TW | M426809 | 4/2012 |
| TW | M432878 | 7/2012 |
| WO | WO 2007114631 A2 * | 10/2007 |
| WO | 2012138602 A2 | 10/2012 |

* cited by examiner

KEYBOARD

BACKGROUND OF THE INVENTION

1. Field of the Invention

The present invention relates to a keyboard, and more specifically, to a keyboard of disposing a capacitive touch sensing sheet under a non-conductive board.

2. Description of the Prior Art

With development of touch sensing technology, a capacitive touch sensing sheet has been integrated into a keyboard to make the keyboard have a keyswitch input function and a touch sensing function, so as to improve convenience of the keyboard in use. In the prior art, the conventional design is to form corresponding assembly holes on the capacitive touch sensing sheet so that the capacitive touch sensing sheet could be directly disposed under the keycap. However, the aforesaid design usually makes the assembly process of the keyboard time-consuming and strenuous and causes the problem that the assembly holes may affect the touch sensitivity of the capacitive touch sensing sheet.

SUMMARY OF THE INVENTION

An objective of the present invention is to provide a keyboard of disposing a capacitive touch sensing sheet under the non-conductive board for solving the aforesaid problem.

According to an embodiment of the present invention, a keyboard includes a non-conductive board, a plurality of keyswitches, and a capacitive touch sensing sheet. The plurality of keyswitches is disposed on the non-conductive board. Each keyswitch includes a keycap and a support device. The support device is connected to the keycap and the non-conductive board for making the keycap movable between a pressing position and a non-pressing position relative to the non-conductive board. The capacitive touch sensing sheet is disposed under the non-conductive board for providing a cursor signal to a computer device.

According to another embodiment of the present invention, a keyboard includes a plastic board, a plurality of keyswitches, and a capacitive touch sensing sheet. The plurality of keyswitches is disposed on the plastic board, each keyswitch includes a keycap and a support device. The support device is connected to the keycap and the plastic board for making the keycap movable between a pressing position and a non-pressing position relative to the plastic board. The capacitive touch sensing sheet is disposed under the plastic board for providing a cursor signal to a computer device.

In summary, the present invention adopts the design in which the capacitive touch sensing sheet is disposed under the non-conductive board instead of the prior art design in which the capacitive touch sensing sheet is disposed under the keycap. In such a manner, since the present invention utilizes disposal of the non-conductive board to prevent the metal shielding effect and there is no need to form the assembly holes on the capacitive touch sensing sheet in the present invention, the present invention could efficiently simplify the assembly process of the keyboard and solve the prior art problem that the assembly holes may affect the touch sensitivity of the capacitive touch sensing sheet, so as to reduce the manufacturing cost of the keyboard as well as further improve the touch sensitivity of the keyboard.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
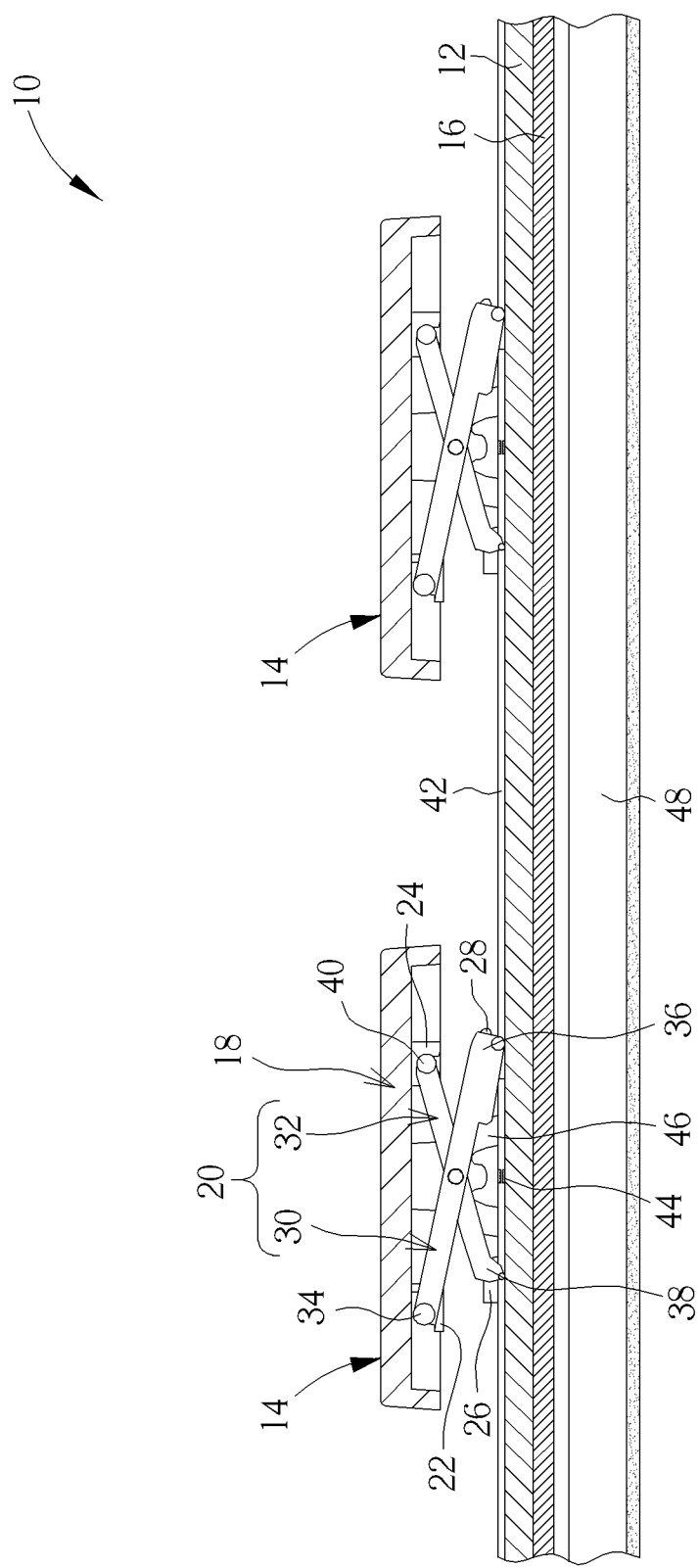
FIG. 1 is a partial sectional diagram of a keyboard according to a first embodiment of the present invention.
Figure 2:
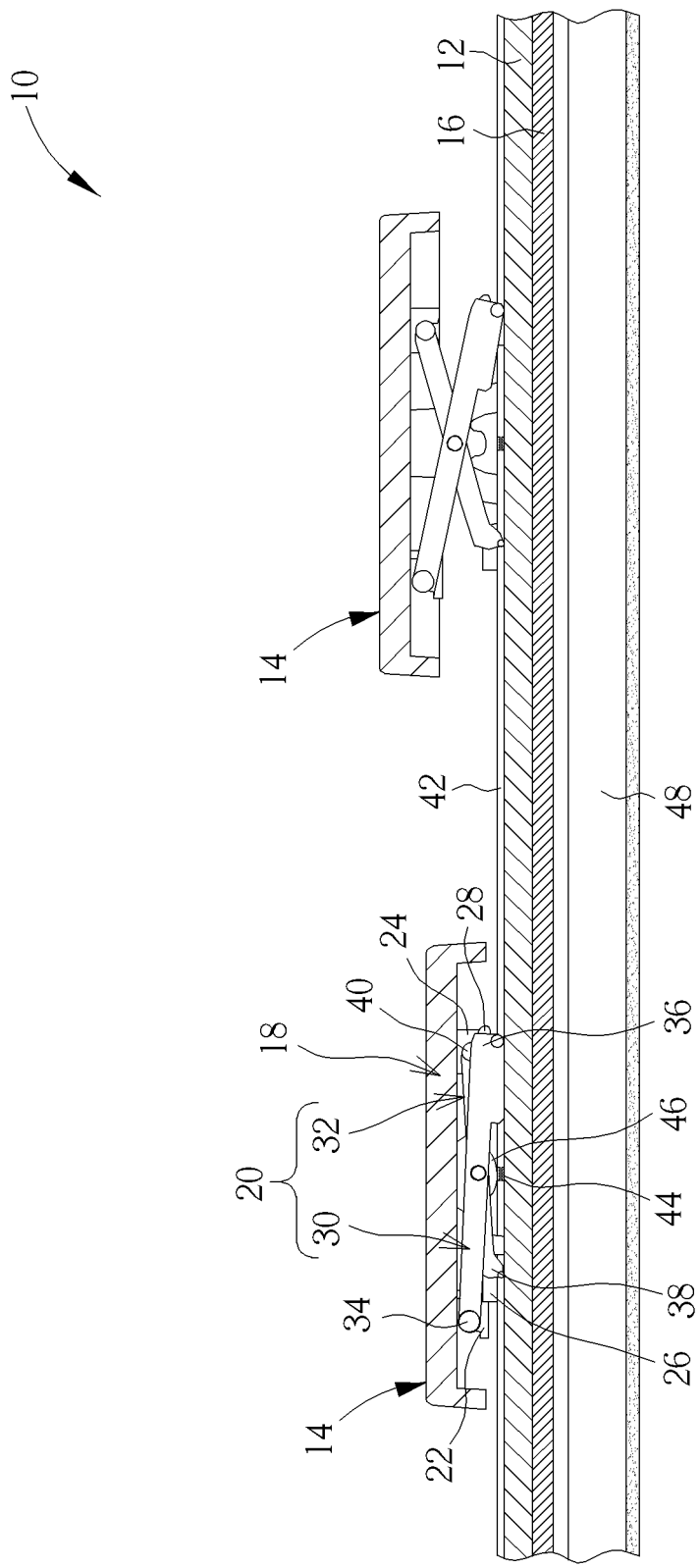
FIG. 2 is a partial sectional diagram of one keyswitch on the keyboard in FIG. 1 being pressed to a pressing position.

Please refer to FIG. 1 and FIG. 2. FIG. 1 is a partial sectional diagram of a keyboard 10 according to a first embodiment of the present invention. FIG. 2 is a partial sectional diagram of one keyswitch 14 on the keyboard 10 in FIG. 1 being pressed to a pressing position. The keyboard 10 could be preferably a computer keyboard, but not limited thereto. For example, the keyboard 10 could also be applied to a portable electronic device having a foldable mechanism composed of an upper cover and a lower casing (e.g. a notebook or a foldable keyboard device). As shown in FIG. 1 and FIG. 2, the keyboard 10 includes a non-conductive board 12, a plurality of keyswitches 14, and a capacitive touch sensing sheet 16. The non-conductive board 12 could be preferably made of plastic material. Each keyswitch 14 is disposed on the non-conductive board 12 for a user to press so as to perform desired input operations.

Each keyswitch 14 includes a keycap 18 and a support device 20. The support device 20 is connected to the keycap 18 and the non-conductive board 12. In this embodiment, the keycap 18 has a first sliding groove 22 and a first engaging groove 24 and the non-conductive board 12 has a second sliding groove 26 and a second engaging groove 28. In this embodiment, the second sliding groove 26 and the second engaging groove 28 are preferably formed on the non-conductive board 12 by an insert molding process. The support device 20 includes a first support member 30 and a second support member 32, wherein the first support member 30 rotatably intersects with the second support member 32. The ends of first support member 30 are movably connected to the keycap 18 and non-conductive board 12 individually and the ends of the second support member 32 are movably connected to the keycap 18 and non-conductive board 12 individually, meaning that all designs in which the keycap 18 could move upward and downward relative to the non-conductive board 12 by utilizing the first support member 30 and the second support member 32 to movably connect to the keycap 18 and the non-conductive board 12 could be adopted by the present invention. In this embodiment, the first support member 30 has a first sliding portion 34 and a first pivot portion 36. The first sliding portion 34 is slidably disposed in the first sliding groove 22, and the first pivot portion 36 is rotatably disposed in the second engaging groove 28. The second support member 32 has a second sliding portion 38 and a second pivot portion 40. The second sliding portion 38 is slidably disposed in the second sliding groove 26, and the second pivot portion 40 is rotatably disposed in the first engaging groove 24. Accordingly, via the aforesaid connection design of the support device 20, the keycap 18 could move upward and downward between a non-pressing position as shown in FIG. 1 and the pressing position as shown in FIG. 2 relative to the non-conductive board 12.

The capacitive touch sensing sheet 16 is disposed under the non-conductive board 12. The capacitive touch sensing sheet 16 is used for providing a cursor signal to a computer device having the keyboard 10 installed thereon so that the user could perform related touch operations (e.g. a cursor controlling operation). Furthermore, the keyboard 10 could further include a circuit board 42. The circuit board 42 is disposed on the non-conductive board 12 and has a switch 44 corresponding to each keyswitch 14 respectively. The switch 44 could be, but not limited thereto, a membrane switch or other trigger-type switch. Each keyswitch 14 could further include an elastic member 46. The elastic member 46 is disposed between the circuit board 42 and the keycap 18 for providing elastic force while the keycap 18 moves upward and downward relative to the non-conductive board 12. The elastic member 46 could be a rubber dome, but not limited thereto. Accordingly, when the keycap 18 of the keyswitch 14 is pressed to the pressing position as shown in FIG. 2, the elastic member 46 triggers the switch 44 of the circuit board 42, so as to execute the desired function correspondingly.

Furthermore, in this embodiment, the keyboard 10 could further include a backlight module 48. The backlight module 48 is disposed under the capacitive touch sensing sheet 16. Correspondingly, the non-conductive board 12 could be preferably made of transparent plastic material, and the capacitive touch sensing sheet 16 could be preferably made of indium tin oxide (ITO) material. In such a manner, light provided by the backlight module 48 could pass through the non-conductive board 12 and the capacitive touch sensing sheet 16 to emit out of each keyswitch 14, so that the keyboard 10 could have a light emitting function.

Via assembly of the non-conductive board 12 with the plurality of keyswitches 14 and the capacitive touch sensing sheet 16, the keyboard 10 could have a keyswitch input function and a touch sensing function. To be more specific, the keyboard 10 could utilize assembly of the keyswitch 14 with the circuit board 42 and the elastic member 46 to allow the user to perform keyswitch input operations (e.g. a paperwork processing operation) in a keyswitch pressing manner, which could be regarded as a keyswitch input mode of the keyboard 10. On the other hand, the keyboard 10 could utilize the capacitive sensing function of the capacitive touch sensing sheet 16 to allow the user to perform touch operations (e.g. a cursor controlling operation) by sliding his finger over the plurality of keyswitches 14, which could be regarded as a touch mode of the keyboard 10. Furthermore, the capacitive touch sensing sheet 16 could be further used for detecting keyswitch signals generated by at least one of the plurality of keyswitches 14. That is, the present invention could further utilize the capacitive sensing function of the capacitive touch sensing sheet 16 to simulate the keyswitch pressing motion, so that the user could perform the keyswitch input operations and the touch operations of the keyboard 10 in the touch mode of the keyboard 10.

To be noted, for preventing the keyswitch input function and the touch sensing function of the keyboard 10 from interfering with each other, the keyboard 10 could adopts a mode switch design to selectively switch to the touch mode or the keyswitch input mode. For example, the user could perform the mode switch operation of the keyboard 10 by pressing at least one of the plurality of keyswitches (e.g. long pressing one number keyswitch or pressing plural function keyswitches) or by a gesture (e.g. quickly sliding his finger from bottom left to top right on the keyboard 10 over a specific distance) which could be sensed by the capacitive touch sensing sheet 16, but not limited thereto. In other words, all designs in which the keyboard 10 could be selectively switched to the touch mode or the keyswitch input mode (e.g. additionally disposing a switch knob on the keyboard 10) could be adopted by the present invention.

Figure 3:
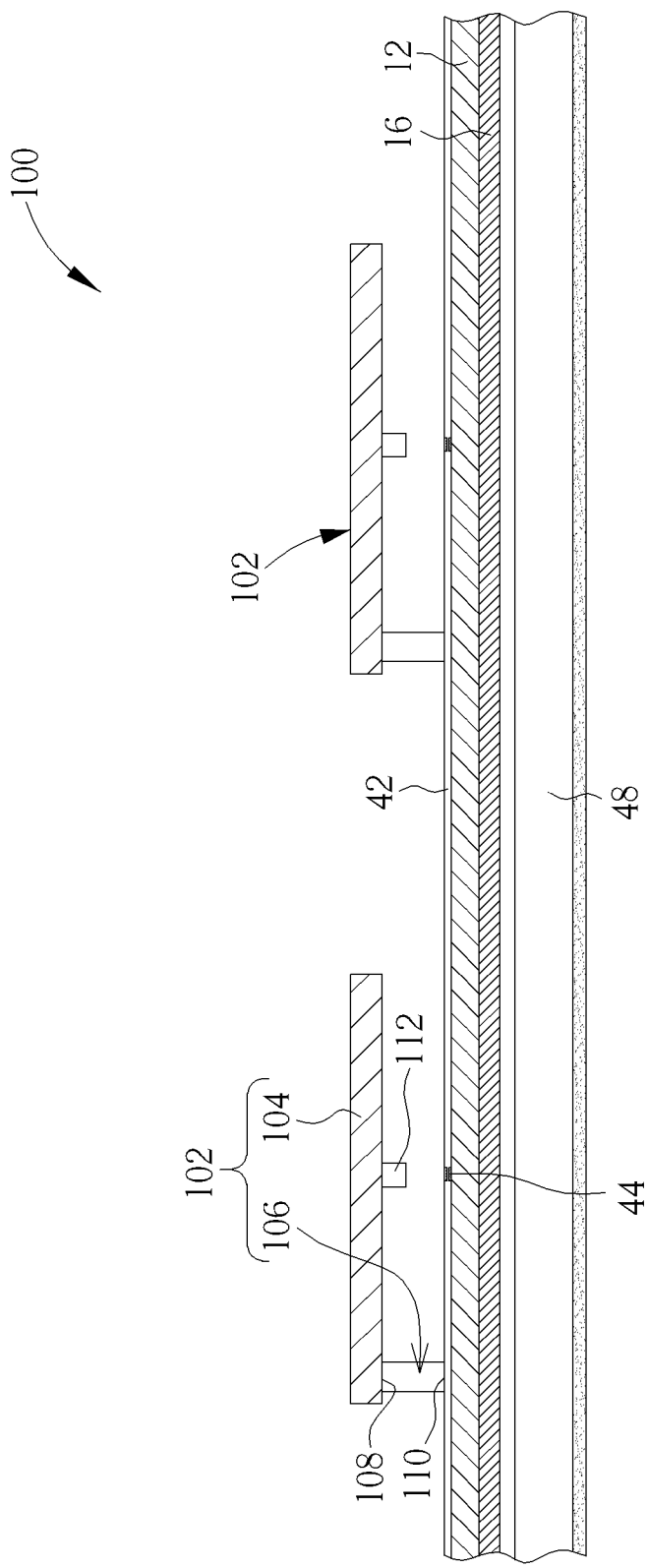
FIG. 3 is a partial sectional diagram of a keyboard according to a second embodiment of the present invention.

Furthermore, the keyswitch pressing design adopted by the present invention is not limited to the aforesaid embodiment. That is, all designs of utilizing a support device to make the keycap movable upward and downward relative to the non-conductive board could be adopted by the present invention. For example, please refer to FIG. 3, which is a partial sectional diagram of a keyboard 100 according to a second embodiment of the present invention. Components both mentioned in the second embodiment and the first embodiment represent components with similar functions or structures, and the related description is therefore omitted herein. The major difference between the keyboard 100 and the keyboard 10 is the structural design of the support device. As shown in FIG. 3, the keyboard 100 includes the non-conductive board 12, a plurality of keyswitches 102, the capacitive touch sensing sheet 16, the circuit board 42, and the backlight module 48. The plurality of keyswitches 102 is disposed on the non-conductive board 12. Each keyswitch 102 includes a keycap 104 and a support device 106. In this embodiment, the support device 106 is an arm structure having a free end portion 108 and a fixing end portion 110. The keycap 104 is connected to the free end portion 108, and the fixing end portion 110 is disposed on the non-conductive board 12. In such a manner, via the connection design of the support device 106, the keycap 104 could move upward and downward relative to the non-conductive board 12. Furthermore, as shown in FIG. 3, the keycap 102 could have a triggering portion 112. Accordingly, when the keycap 104 is pressed by the user, the triggering portion 112 triggers the switch 44 of the circuit board 42, so as to execute the desired function correspondingly. As for other related description for the keyboard 100 (e.g. the touch operation and the mode switch operation of the keyboard 100), it could be reasoned according to the first embodiment and therefore omitted herein.

Figure 4:
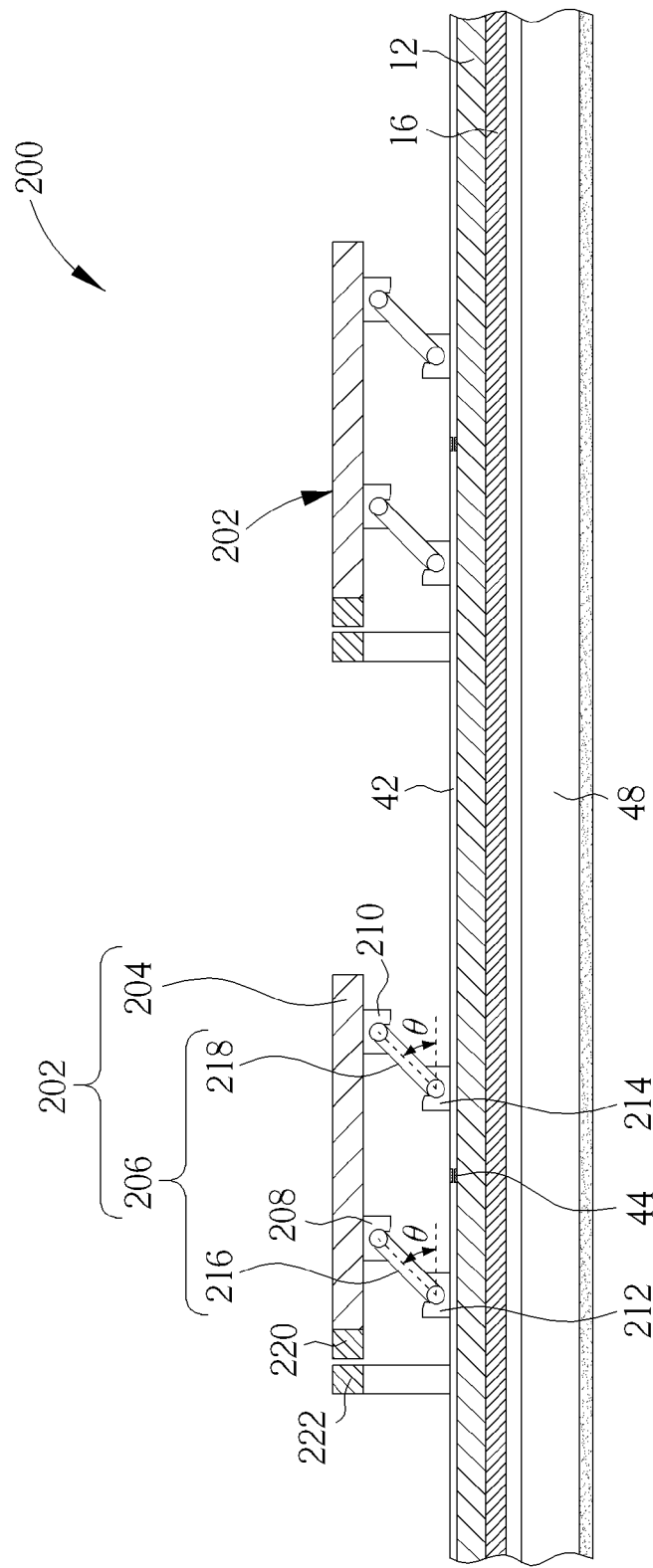
FIG. 4 is a partial sectional diagram of a keyboard according to a third embodiment of the present invention.

Please refer to FIG. 4, which is a partial sectional diagram of a keyboard 200 according to a third embodiment of the present invention. Components both mentioned in the third embodiment and the first embodiment represent components with similar functions or structures, and the related description is therefore omitted herein. The major difference between the keyboard 200 and the keyboard 10 is the structural design of the support device. As shown in FIG. 4, the keyboard 200 includes the non-conductive board 12, a plurality of keyswitches 202, the capacitive touch sensing sheet 16, the circuit board 42, and the backlight module 48. The keyswitch 202 includes a keycap 204 and a support device 206. In this embodiment, the keycap 204 has a first engaging groove 208 and a second engaging groove 210, the non-conductive board 12 has a third engaging groove 212 and a fourth engaging groove 214, and the support device 206 includes a first support member 216 and a second support member 218. The first support member 216 and the second support member 218 cooperatively form a tilt angle $\theta$ with the non-conductive board 12. The first support member 216 is rotatably pivoted to the first engaging groove 208 and the third engaging groove 212. The second support member 218 is rotatably pivoted to the second engaging groove 210 and the fourth engaging groove 214. In such a manner, via the connection design of the support device 206, the keycap 204 could move upward and downward relative to the non-conductive board 12.

Furthermore, the keycap 204 could further have a magnetic end portion 220, and the non-conductive board 12 could further have a magnetic rod portion 222, wherein one of the magnetic end portion 220 and the magnetic rod portion 222 is a magnet and the other one of the magnetic end portion 220 and the magnetic rod portion 222 is a magnet or is made of magnetic material (e.g. iron or other metal material). Accordingly, a magnetic absorption force between the magnetic end portion 220 and the magnetic rod portion 222 could drive the keycap 204 to move from the pressing position back to the non-pressing position with rotation of the first support member 216 and the second support member 218, so that the keycap 204 could have a return function. As for other related description for the keyboard 200 (e.g. the touch operation, the mode switch operation, and the switch triggering design of the keyboard 200), it could be reasoned according to the aforesaid embodiments and therefore omitted herein.

Figure 5:
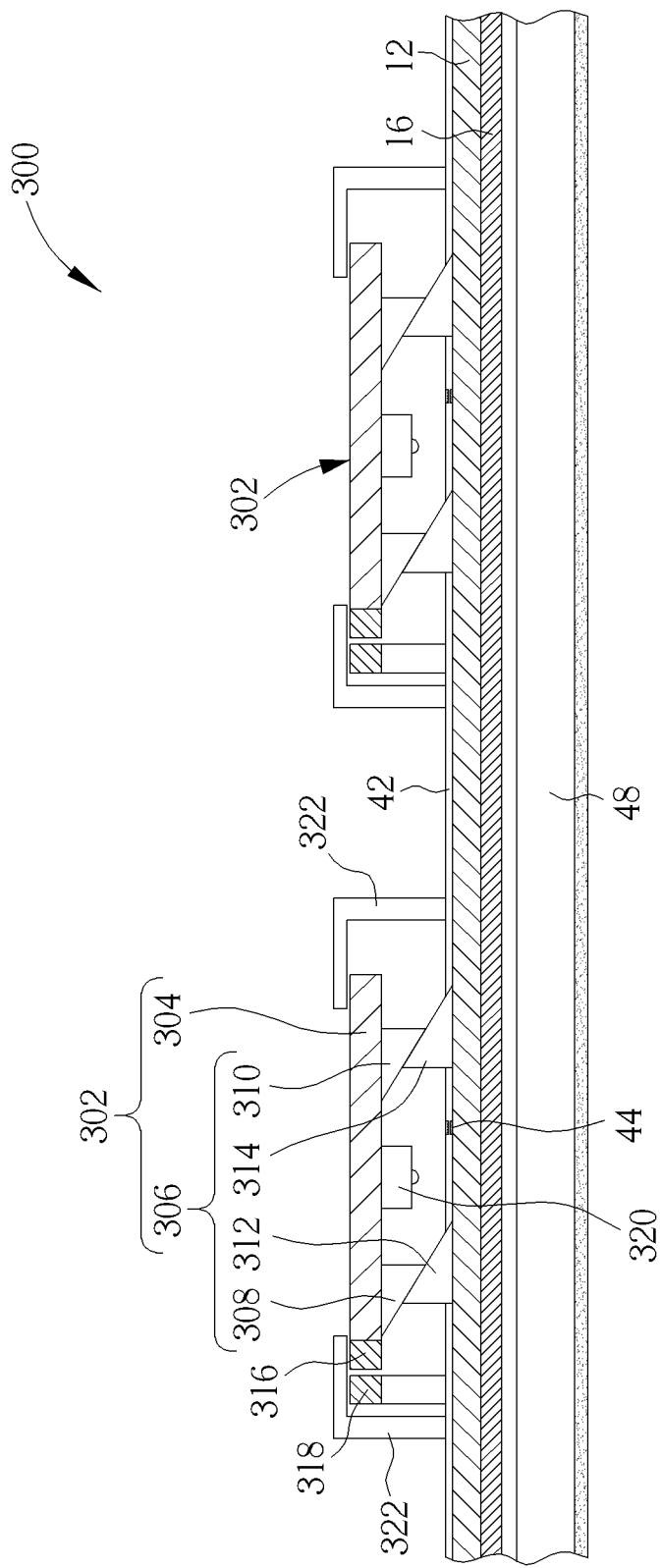
FIG. 5 is a partial sectional diagram of a keyboard according to a fourth embodiment of the present invention.

Please refer to FIG. 5, which is a partial sectional diagram of a keyboard 300 according to a fourth embodiment of the present invention. Components both mentioned in the fourth embodiment and the first embodiment represent components with similar functions or structures, and the related description is therefore omitted herein. The major difference between the keyboard 300 and the keyboard 10 is the structural design of the support device. As shown in FIG. 5, the keyboard 300 includes the non-conductive board 12, a plurality of keyswitches 302, the capacitive touch sensing sheet 16, the circuit board 42, and the backlight module 48. The keyswitch 302 includes a keycap 304 and a support device 306. In this embodiment, the support device 306 includes a first inclined-surface portion 308, a second inclined-surface portion 310, a third inclined-surface portion 312, and a fourth inclined-surface portion 314. The first inclined-surface portion 308 and the second inclined-surface portion 310 are disposed on the keycap 304 respectively, and the third inclined-surface portion 312 and the fourth inclined-surface portion 314 are disposed on the non-conductive board 12 respectively. In such a manner, the first inclined-surface portion 308 could slidably cooperate with the third inclined-surface portion 312 and the second inclined-surface portion 310 could slidably cooperate with the fourth inclined-surface portion 314, so that the keycap 304 could move upward and downward relative to the non-conductive board 12.

Furthermore, the keycap 304 could have a magnetic end portion 316, and the non-conductive board 12 could have a magnetic rod portion 318, wherein one of the magnetic end portion 316 and the magnetic rod portion 318 is a magnet and the other one of the magnetic end portion 316 and the magnetic rod portion 318 is a magnet or is made of magnetic material (e.g. iron or other metal material). Accordingly, a magnetic absorption force between the magnetic end portion 316 and the magnetic rod portion 318 could drive the keycap 304 to move from the pressing position back to the non-pressing position with sliding of the first inclined-surface portion 308 relative to the third inclined-surface portion 312 and sliding of the second inclined-surface portion 310 relative to the fourth inclined-surface portion 314 so that the keycap 304 could have a return function.

In addition, as shown in FIG. 5, the keycap 304 could have a triggering portion 320. Accordingly, when the keycap 304 is pressed by the user, the triggering portion 320 triggers the switch 44 of the circuit board 42, so as to execute the desired function correspondingly. Furthermore, in this embodiment, the non-conductive board 12 could further have at least one bending arm portion 322 (two shown in FIG. 5). The bending arm portion 322 is disposed at a side of the keyswitch 302. The bending arm portion 322 is used for blocking the keycap 304 to limit the height of the keycap 304 relative to the non-conductive board 12. Accordingly, the overall height of the keyswitch 302 could be reduced so as to be advantageous to the thinning design of the keyboard 300. The aforesaid design could also be applied to the third embodiment. As for other related description for the keyboard 300 (e.g. the touch operation and the mode switch operation of the keyboard 300), it could be reasoned according to the aforesaid embodiments and therefore omitted herein.

In summary, the present invention adopts the design in which the capacitive touch sensing sheet is disposed under the non-conductive board instead of the prior art design in which the capacitive touch sensing sheet is disposed under the keycap. In such a manner, since the present invention utilizes disposal of the non-conductive board to prevent the metal shielding effect and there is no need to form the assembly holes on the capacitive touch sensing sheet in the present invention, the present invention could efficiently simplify the assembly process of the keyboard and solve the prior art problem that the assembly holes may affect the touch sensitivity of the capacitive touch sensing sheet, so as to reduce the manufacturing cost of the keyboard as well as further improve the touch sensitivity of the keyboard.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A keyboard comprising:
   a non-conductive board;
   a plurality of keyswitches disposed on the non-conductive board, each keyswitch comprising:
      a keycap; and
      a support device connected to the keycap and the non-conductive board for making the keycap movable between a pressing position and a non-pressing position relative to the non-conductive board;
   a circuit board disposed on the non-conductive board and having a switch corresponding to each keyswitch respectively, the keycap having a triggering portion, the triggering portion triggering the switch when the keycap is pressed to the pressing position; and
   a capacitive touch sensing sheet disposed at a side of the non-conductive board away from the keyswitch and located under the non-conductive board and the circuit board for providing a cursor signal to a computer device.

2. The keyboard of claim 1, wherein the keyswitch has a first support member that rotatably intersects with a second support member, the ends of the first support member are movably connected to the keycap and the non-conductive board individually, and the ends of the second support member are movably connected to the keycap and the non-conductive board individually.

3. The keyboard of claim 2, wherein the non-conductive board is made of plastic material, the non-conductive board has a sliding groove and an engaging groove, the first support member is rotatably pivoted to the engaging groove, the second support member is slidably disposed to the sliding groove, the sliding groove and the engaging groove are formed on the non-conductive board by an insert molding process.

4. The keyboard of claim 2, wherein the non-conductive board is made of transparent plastic material, the capacitive touch sensing sheet is made of indium tin oxide (ITO) material, and the keyboard further comprises:
   a backlight module disposed under the capacitive touch sensing sheet for providing light to each keyswitch.

5. The keyboard of claim 1, wherein the support device is an arm structure, the arm structure has a free end portion and a fixing end portion, the keycap is connected to the free end portion, and the fixing end portion is disposed on the non-conductive board.

6. The keyboard of claim 1, wherein the capacitive touch sensing sheet is further used for detecting keyswitch signals generated by at least one keyswitch of the plurality of keyswitches.

7. The keyboard of claim 1, wherein the non-conductive board is made of plastic material.

8. The keyboard of claim 1, wherein the keycap has a first engaging groove and a second engaging groove, the non-conductive board has a third engaging groove and a fourth engaging groove, the support device comprises a first support member and a second support member, the first support member and the second support member form a tilt angle cooperatively with the non-conductive board, the first support member is rotatably pivoted to the first engaging groove and the third engaging groove, and the second support member is rotatably pivoted to the second engaging groove and the fourth engaging groove.

9. The keyboard of claim 8, wherein the keycap further has a magnetic end portion, the non-conductive board further has a magnetic rod portion, and a magnetic absorption force between the magnetic end portion and the magnetic rod portion drives the keycap to move from the pressing position to the non-pressing position with rotation of the first support member and the second support member.

10. The keyboard of claim 9, wherein one of the magnetic end portion and the magnetic rod portion is a magnet, and the other one of the magnetic end portion and the magnetic rod portion is a magnet or is made of magnetic material.

11. The keyboard of claim 1, wherein the support device comprises a first inclined-surface portion, a second inclined-surface portion, a third inclined-surface portion, and a fourth inclined-surface portion, the first inclined-surface portion and the second inclined-surface portion are disposed on the keycap respectively, the third inclined-surface portion and the fourth inclined-surface portion are disposed on the non-conductive board respectively, and the first inclined-surface portion slidably cooperates with the third inclined-surface portion and the second inclined-surface portion slidably cooperates with the fourth inclined-surface portion, so as to make the keycap capable of moving between the pressing position and the non-pressing position relative to the non-conductive board.

12. The keyboard of claim 11, wherein the keycap further has a magnetic end portion, the non-conductive board further has a magnetic rod portion, and a magnetic absorption force between the magnetic end portion and the magnetic rod portion drives the keycap to move from the pressing position to the non-pressing position with sliding of the first inclined-surface portion relative to the third inclined-surface portion and sliding of the second inclined-surface portion relative to the fourth inclined-surface portion.

13. The keyboard of claim 12, wherein one of the magnetic end portion and the magnetic rod portion is a magnet, and the other one of the magnetic end portion and the magnetic rod portion is a magnet or is made of magnetic material.

14. A keyboard comprising:
a plastic board;
a plurality of keyswitches disposed on the plastic board, each keyswitch comprising:
  a keycap; and
  a support device connected to the keycap and the plastic board for making the keycap movable between a pressing position and a non-pressing position relative to the plastic board;
a circuit board is disposed on the plastic board and having a switch corresponding to each keyswitch respectively, the keycap having a triggering portion, the triggering portion triggering the switch when the keycap is pressed to the pressing position; and
a capacitive touch sensing sheet disposed at a side of the plastic board away from the keyswitch and located under the plastic board and the circuit board for providing a cursor signal to a computer device.

15. The keyboard of claim 14, wherein the keyswitch has a first support member that rotatably intersects with a second support member, the ends of the first support member are movably connected to the keycap and the plastic board individually, and the ends of the second support member are movably connected to the keycap and the plastic board individually.

16. The keyboard of claim 15, wherein the plastic board is made of plastic material, the plastic board has a sliding groove and an engaging groove, the first support member is rotatably pivoted to the engaging groove, the second support member is slidably disposed to the sliding groove, the sliding groove and the engaging groove are formed on the plastic board by an insert molding process.

17. The keyboard of claim 15, wherein the plastic board is made of transparent plastic material, the capacitive touch sensing sheet is made of indium tin oxide material, and the keyboard further comprises:
a backlight module disposed under the capacitive touch sensing sheet for providing light to each keyswitch.

18. The keyboard of claim 14, wherein the support device is an arm structure, the arm structure has a free end portion and a fixing end portion, the keycap is connected to the free end portion, and the fixing end portion is disposed on the plastic board.

19. The keyboard of claim 14, wherein the capacitive touch sensing sheet is further used for detecting keyswitch signals generated by at least one keyswitch of the plurality of keyswitches.

20. The keyboard of claim 14, wherein the keycap has a first engaging groove and a second engaging groove, the plastic board has a third engaging groove and a fourth engaging groove, the support device comprises a first support member and a second support member, the first support member and the second support member form a tilt angle cooperatively with the plastic board, the first support member is rotatably pivoted to the first engaging groove and the third engaging groove, and the second support member is rotatably pivoted to the second engaging groove and the fourth engaging groove.

21. The keyboard of claim 20, wherein the keycap further has a magnetic end portion, the plastic board further has a magnetic rod portion, and a magnetic absorption force between the magnetic end portion and the magnetic rod portion drives the keycap to move from the pressing position to the non-pressing position with rotation of the first support member and the second support member.

22. The keyboard of claim 21, wherein one of the magnetic end portion and the magnetic rod portion is a magnet, and the other one of the magnetic end portion and the magnetic rod portion is a magnet or is made of magnetic material.

23. The keyboard of claim 14, wherein the support device comprises a first inclined-surface portion, a second inclined-surface portion, a third inclined-surface portion, and a fourth inclined-surface portion, the first inclined-surface portion and the second inclined-surface portion are disposed on the keycap respectively, the third inclined-surface portion and the fourth inclined-surface portion are disposed on the plastic board respectively, and the first inclined-surface portion slidably cooperates with the third inclined-surface portion and the second inclined-surface portion slidably cooperates with the fourth inclined-surface portion, so as to make the keycap capable of moving between the pressing position and the non-pressing position relative to the plastic board.

24. The keyboard of claim 23, wherein the keycap further has a magnetic end portion, the plastic board further has a magnetic rod portion, and a magnetic absorption force between the magnetic end portion and the magnetic rod portion drives the keycap to move from the pressing position to the non-pressing position with sliding of the first inclined-surface portion relative to the third inclined-surface portion and sliding of the second inclined-surface portion relative the fourth inclined-surface portion.

25. The keyboard of claim 24, wherein one of the magnetic end portion and the magnetic rod portion is a magnet, and the other one of the magnetic end portion and the magnetic rod portion is a magnet or is made of magnetic material.

* * * * *